(12) United States Patent
Weling

(10) Patent No.: US 6,353,261 B1
(45) Date of Patent: Mar. 5, 2002

(54) METHOD AND APPARATUS FOR REDUCING INTERCONNECT RESISTANCE USING AN INTERCONNECT WELL

(75) Inventor: Milind Weling, San Jose, CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/303,891

(22) Filed: May 3, 1999

(51) Int. Cl.[7] .......................... H01L 23/48; H01L 23/52
(52) U.S. Cl. ...................... 257/773; 257/750; 257/758
(58) Field of Search ................................ 257/773, 750, 257/758, 774, 759, 752; 438/618, 666, 629, 637, 639, 640, 667, 668, 672, 675, 700, 701, 713, 978, 652, 118, 662

(56) References Cited

U.S. PATENT DOCUMENTS

| 4,916,509 | A | | 4/1990 | Blanchard et al. ............ 357/65 |
|---|---|---|---|---|
| 5,512,514 | A | * | 4/1996 | Lee .............................. 438/618 |
| 5,686,759 | A | * | 11/1997 | Hyde et al. .................. 257/730 |
| 5,854,515 | A | | 12/1998 | Bandyopadhyay et al. . 257/775 |
| 5,932,928 | A | | 8/1999 | Clampitt ...................... 257/758 |
| 6,020,647 | A | * | 2/2000 | Skala et al. .................. 257/784 |
| 6,100,591 | A | * | 8/2000 | Ishii ............................ 257/773 |

* cited by examiner

Primary Examiner—Eddie Lee
Assistant Examiner—Jhihan B Clark
(74) Attorney, Agent, or Firm—Wagner, Murabito & Hao LLP

(57) ABSTRACT

An apparatus for reducing interconnect resistance using optimized trench geometry. One embodiment comprises an interconnect line and an interconnect well. The interconnect line, comprised of a conductive material, has a depth and exists in a first circuit layer of a multilayered Integrated Circuit (IC). The interconnect well is coupled to the interconnect line and is insulated from other conductive materials in the first circuit layer, and in the plurality of subsequent adjacent layers. The interconnect well has a depth in said multilayered IC that exceeds said depth of said interconnect line.

6 Claims, 5 Drawing Sheets

METHOD AND APPARATUS FOR REDUCING INTERCONNECT RESISTANCE USING AN INTERCONNECT WELL

TECHNICAL FIELD

The field of the present invention pertains to Integrated Circuit (IC) fabrication. More particularly, the present invention relates to the field of interconnect lines for an IC.

BACKGROUND ART

ICs use layers of semiconductor material, insulator material, and conductor material to build up integrated circuit patterns. Today's integrated circuits typically have multiple two-dimensional circuits layered on top of each other in a third dimension and separated by a dielectric layer. The different layers within the multilayered IC are formed by vapor deposition, electroplating, or other traditional means. Components, such as diodes, resistors, transistors, etc. are formed in these layers and are coupled together by interconnect lines Referring to Prior Art FIG. 1A, a top view of a prior art multilayered IC 100, is shown. Similarly, Prior Art FIG. 1B presents a view of several cross-sections taken from the top view of the prior art multilayered IC 100. Multilayered IC 100 is comprised of a first circuit layer 102 and a second circuit layer 106 separated by a layer 104 made of dielectric material 103 to prevent shorting across two layers of circuits 102 and 106. Interconnect line 108 is formed in a dielectric material 103 in first circuit layer 102 to couple components in first circuit layer 102 that are not shown in the figure. Similarly, interconnect lines 112 and 114 exist in second circuit layer 106. While line 114 in second circuit layer 106 and line 108 in first circuit layer 102 are separated by layer 104 of dielectric material 103, as shown in Section A—A, line 112 in second circuit layer 106 and line 108 in first circuit layer 102 do connect, as shown in Section C—C. The connection is part of the circuit design that requires communication between different circuit layers, e.g. layer 102 and layer 106, at a specific point. The connection is made by an interconnect referred to as a 'via' 110. The via contact 110 consequently forms a threedimensional circuit within the multilayered IC.

As is typical with ICs, there is a demand for faster operating speed in the circuit. The speed of the circuit is limited by, among other things, the delay of a component in the circuit and the delay of the interconnects communicating a signal between multiple components and leads. The delay of the components have been reduced so greatly in modern circuits, that the delay of the interconnects is now becoming a limiting factor in the overall speed of the IC. Consequently, a need arises for an apparatus and a method to decrease the delay of the interconnects in an IC so as to increase the overall speed of the IC.

The delay of the interconnect is described by its time constant, $\tau=RC$, where R is the resistance, in ohms, of a circuit and C is the capacitance, in farads, of the circuit. Conventional improvements to reducing the time constant include the use of low "k" materials to reduce capacitance and the use of electroplated bulk copper for interconnects to reduce resistance. The "k" value refers to the inherent capacitance of a given material based on its permittivity, e.g. $k=1/(4\pi*t*\in)$, where $\in$ is the permittivity of the material in farads/meter. However, additional improvements beyond the use of low k materials are still necessary. Hence, a need exists for an apparatus and method to reduce the resistance of interconnects in an IC.

The resistance of an interconnect is described by the resistivity equation:

$$R=(\rho*1)/A.$$

In this equation, R is the resistance in ohms, or voltseconds/coulomb, $\rho$=resistivity of the material in CM-ohms/ foot, l=length of the conductor in feet, and A is the cross-sectional area of the conductor in circular mils (CM). By viewing the equation, it is apparent that the resistance of a conductor can be decreased by changing any of the variables in the correct direction. As an example, the resistance of the conductor can be reduced by increasing the cross-sectional area, A, of the conductor. However, most ICs have a thickness requirement and an interconnect width requirement that must be satisfied.

Consequently, a need arises for an apparatus and a method that reduces the resistance of an interconnect while maintaining the standard thickness of a circuit layer and a given width of an interconnect line in a multilayer IC.

In summary, a need exists for an apparatus and a method to decrease the delay of the interconnects in an IC so as to increase the overall speed of the IC. To satisfy this goal, a need exists for an apparatus and method to reduce the resistance of interconnects in an IC. More specifically, a need arises for an apparatus and a method to reduce the resistance of an interconnect while maintaining the standard thickness of a layer and a given width of an interconnect line in a multilayer IC.

DISCLOSURE OF THE INVENTION

The present invention provides an apparatus and a method that decreases the delay of the interconnects in an IC so as to increase the overall speed of the IC. The present invention reduces the delay of an interconnect by reducing the resistance of interconnects by increasing the cross-sectional area of the interconnect while maintaining the standard thickness of layers in a multilayer IC and a given width of the interconnect. The present invention uses, in essence, a free cross-sectional area not being used by any other component in the IC.

One embodiment of the present invention increases the cross-sectional area of the interconnect by adding an interconnect well in the multi-layered IC, during fabrication, that is in direct contact with the interconnect line. By increasing the cross-sectional area of the interconnect, the resistance is decreased and consequently, the delay of the interconnect is reduced. The interconnect well can be located between an interconnect line in a first circuit layer and a bottom surface a second circuit layer meeting the following conditions. The second circuit layer design has an insulative material in an area approximately overlaying the interconnect line and the material between the second circuit layer and the interconnect line is designed to be an insulative material. The design referred to is the baseline design of the IC with conventional interconnects. With the addition of an interconnect well, the baseline design becomes a modified design with reduced interconnect delay and other improvements.

In areas where proximate circuit layers of an IC have overlapping interconnects, there is usually insufficient insulative material between the sequential layers of ICs for an interconnect well. This is usually true regardless of whether overlapping interconnect lines in sequential layers are insulated from each other or are coupled to each other. The thickness of insulation provided between adjacent circuit layers is provided to satisfy insulative requirements, e.g. no shorting, and to satisfy capacitive interactions between components in each layer.

However, many areas of the IC have no overlapping interconnects in proximate circuit layers. The result is usually an excess area of insulative material in the multi-layer IC proximate to at least a portion of an interconnect. The present invention creates an interconnect well where the large areas of insulative material exist in the multi-layer IC. The present invention capitalizes on this essentially component-free area of excess insulative material to increase the cross-sectional area of the interconnect line, and consequently reduce its resistance and its delay. The interconnect well probably will not exist for the entire length of an interconnect line because of an interconnect lines existing at intermittent locations in proximate circuit layers that would prohibit the use of an interconnect well at that specific location. Notwithstanding this fact, the present invention still provides a decrease in at least a portion of the length of an interconnect line, and thus, provides at least some reduction in the delay of the interconnect. Sufficient insulative material is left around the interconnect well such that capacitive interaction between proximate conductors is essentially the same as the baseline design.

The interconnect line is usually a copper line deposited on a first circuit layer of a multilayered Integrated Circuit (IC). The interconnect well, also made of copper, exists in at least one of a plurality of subsequent adjacent layers to the layer containing the interconnect line. The subsequent adjacent layers can be originally designed as a dielectric layer or a circuit layer or both. The interconnect well is coupled to the interconnect line but is insulated from other conductive materials in the multilayered IC. Additionally, if an interconnect well exists in a plurality of subsequent adjacent layers, the interconnect well is going to be continuous through these layers. That is, the interconnect well for a given area of an interconnect line is one solid well through the depth of the subsequent adjacent layers. In the present embodiment, the first circuit layer and the plurality of subsequent layers are alternating layers of a circuit layer and a dielectric layer.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the invention. The drawings referred to in this description should be understood as not being drawn to scale except if specifically noted.

PRIOR ART

PRIOR ART

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 1A:
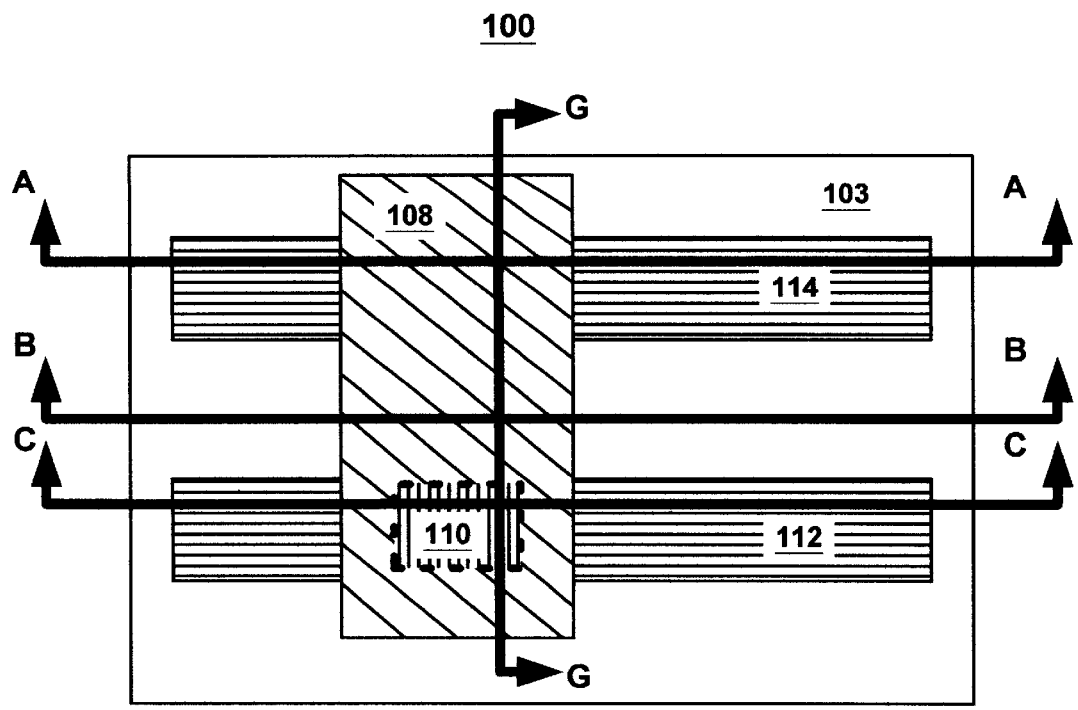
FIG. 1A is a top view of a prior art multilayered Integrated Circuit (IC).
Figure 1B:
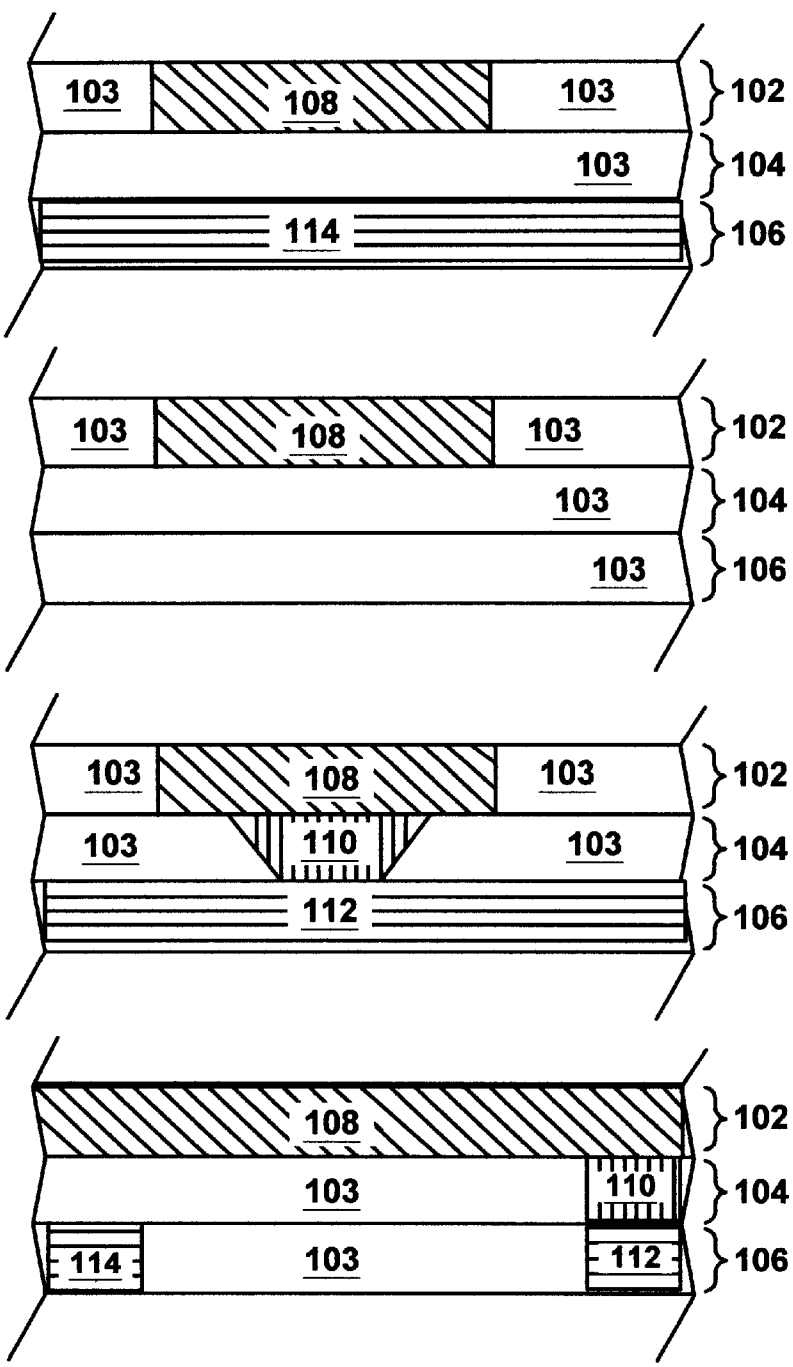
FIG. 1B is a view of several cross-sections taken from the top view of a prior art multilayered IC.
Figure 2A:
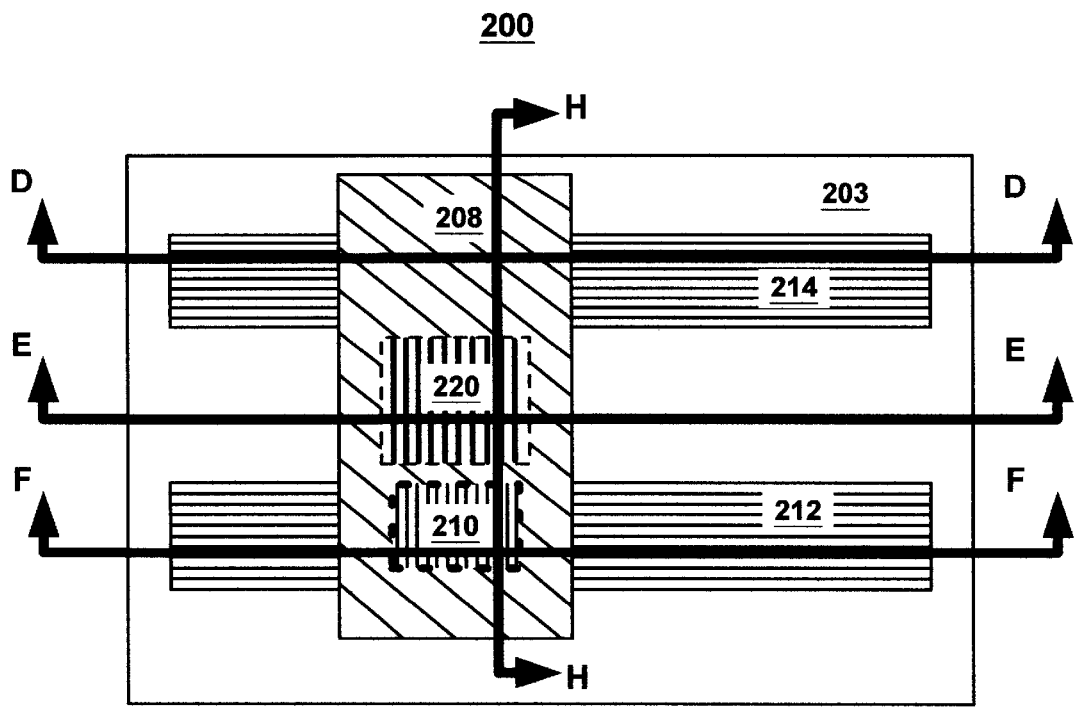
FIG. 2A is a top view of a multilayered IC incorporating an interconnect well, in accordance with one embodiment of the present invention.
Figure 2B:
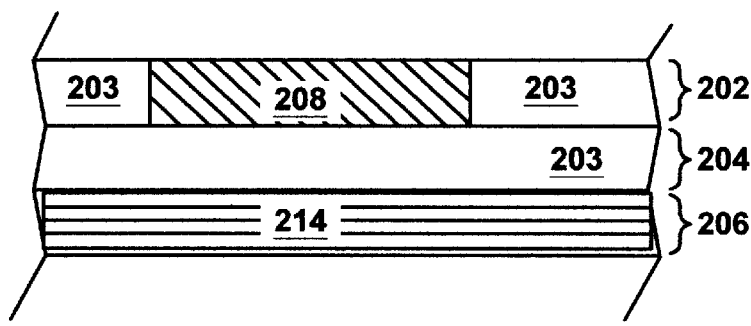
FIG. 2B is a view of several cross-sections taken from a multilayered IC incorporating an interconnect well, in accordance with one embodiment of the present invention.
Figure 2B:
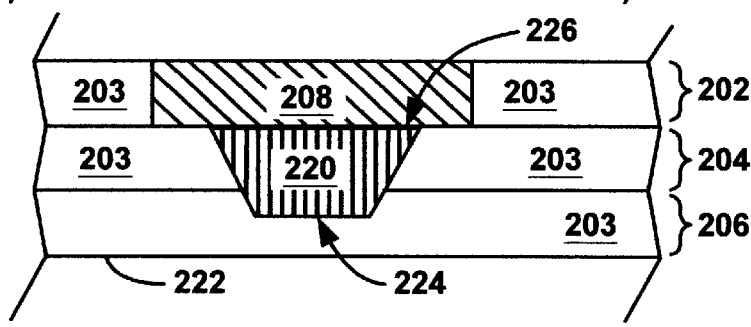
Figure 2B:
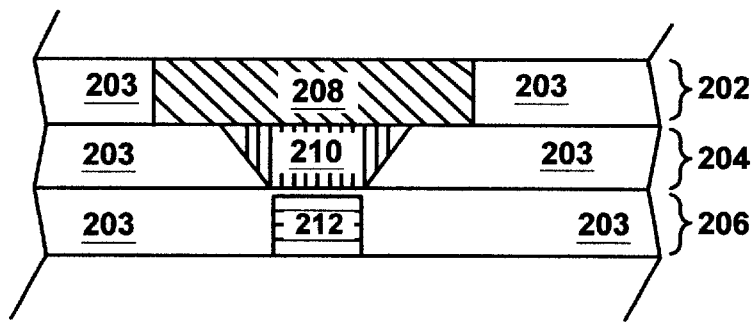
Figure 2B:
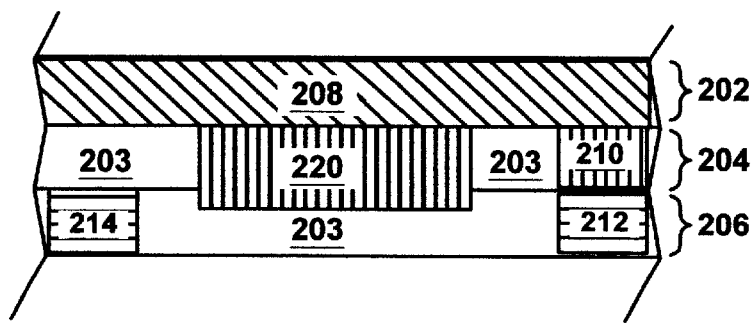

Referring to FIG. 2A, a top view of a multilayered IC 200 having an interconnect well is presented, in accordance with one embodiment of the present invention. Likewise, FIG. 2B presents the cross-sectional views taken from the multilayered IC 200 incorporating an interconnect well of FIG. 2A, in accordance with one embodiment of the present invention.

Multilayered IC 200 is comprised of a first circuit layer 202 and a proximate, or second, circuit layer 206 separated by a layer 204 of dielectric material 203 to prevent shorting across two layers 202 and 206. In the present embodiment, layers 202 and 206 have circuits, comprised of components and interconnects formed in a base of dielectric material 203. Interconnect line 208 exists in first circuit layer 202 to couple unshown components in first circuit layer 202. Interconnect line 208 has a depth in multilayer IC equivalent to the thickness of layer 202. Similarly, interconnect lines 212 and 214 exist in second circuit layer 206. While interconnect line 214 in second circuit layer 206 and interconnect line 208 in first circuit layer 202 are separated by layer 204 of dielectric material 203, as shown in Section D—D, line 212 in second circuit layer 206 and line 208 in first circuit layer 202 do connect, as shown in Section F—F. The connection is made by an interconnect referred to as a 'via' 210. Interconnects, as well as vias, are typically comprised of a conductive material, such as electroplated copper. While the present embodiment shows interconnect lines having thickness equivalent to the thickness of the layer, the present invention is also applicable to an interconnect line having a different thickness. The present embodiment illustrates layers 202, 204, and 206 as subsequent adjacent layers. That is, layer 204 is adjacent to layer 202. In turn, layer 206 is subsequently adjacent to layer 204, etc.

In another embodiment of the present invention, layers 202 and 204 can be thought of as a single layer. That is because they can both have a dielectric material substrate, they can be formed at the same time. Dielectric material 203 in layer 202 and 204 can be built up over layer 206 in one operation. Afterwards, a trench for interconnect line 208 can be formed to a depth that is represented by the thickness of layer 202 illustrated in FIG. 2B, e.g. in the section D—D. If an interconnect well or a via is to be included, then it can be etched in before or after etching a trench for the interconnect line 208. Thus, FIG. 2 illustrates three distinct layers 202, 204, and 206 for purposes of clarity rather than for purposes of requiring a specific fabrication for general IC layers and components upon which the present invention may be practiced. Rather, the present invention is suited to a variety of fabrication techniques.

One embodiment of the present invention provides an interconnect well 220 as illustrated in view E—E. Interconnect well 220 and interconnect line 208 are coupled along surface 226 by having direct contact with each other. In this manner, interconnect well 220 effectively increases the cross-sectional area of interconnect line 208 while maintaining the standard thickness of each layer, e.g. layer 202, 204, and 206, and the given width of the interconnect line, e.g. interconnect line 208. While the present embodiment illustrates interconnect well 220 as a rhomboid cross-section, the present invention is well suited to other cross-sectional configurations. Additionally, while the present embodiment illustrates the contact between interconnect line 208 and interconnect well 220 as being centered, the present invention is equally well suited to other contact patterns that effectively provides conduction between interconnect line 208 and interconnect well 220.

The present embodiment shows that interconnect well 220 exists in intermediate layer 204 and in lower layer 206. However, the present invention is well suited to having interconnect well 220 exist only in intermediate layer 204 or to exist to the full depth of proximate, or second, circuit layer 206. This decision rests upon the particular circuit environment and design. If additional layers of circuits and dielectric material exist above, below, or between the layers shown, and the criteria for interconnect well, as described herein, are satisfied, then interconnect well 220 can be extended into these other layers. These and other embodiments effectively increase the cross-sectional area of an interconnect line by using an interconnect well. By increasing the cross-sectional area of interconnect 208 to any degree, the present invention reduces the resistance of interconnect 208, and consequently reduces the delay of the interconnect and the IC in which it resides.

As indicated in section H—H of FIG. 2B, interconnect well 220 can be located between an interconnect line in a first circuit layer and a bottom surface of a second circuit layer meeting the following conditions. The second circuit layer design has an insulative material in an area approximately overlaying the interconnect line and the material between second circuit layer and the interconnect line is designed to be an insulative material. Hence, because conductors, e.g. interconnect line 214 and 212, exist in adjacent circuit layer 206 approximately overlaying an interconnect line, e.g. interconnect line 208, those areas are not ideal candidates for interconnect well 220. However, the space in between interconnect line 212 and 214 is insulative material 203 that approximately overlays interconnect line 208 of first circuit layer 202. Hence, this area is a candidate for interconnect well 220. Consequently, interconnect well provides reduced resistance and delay for interconnect line 208.

Figure 3:
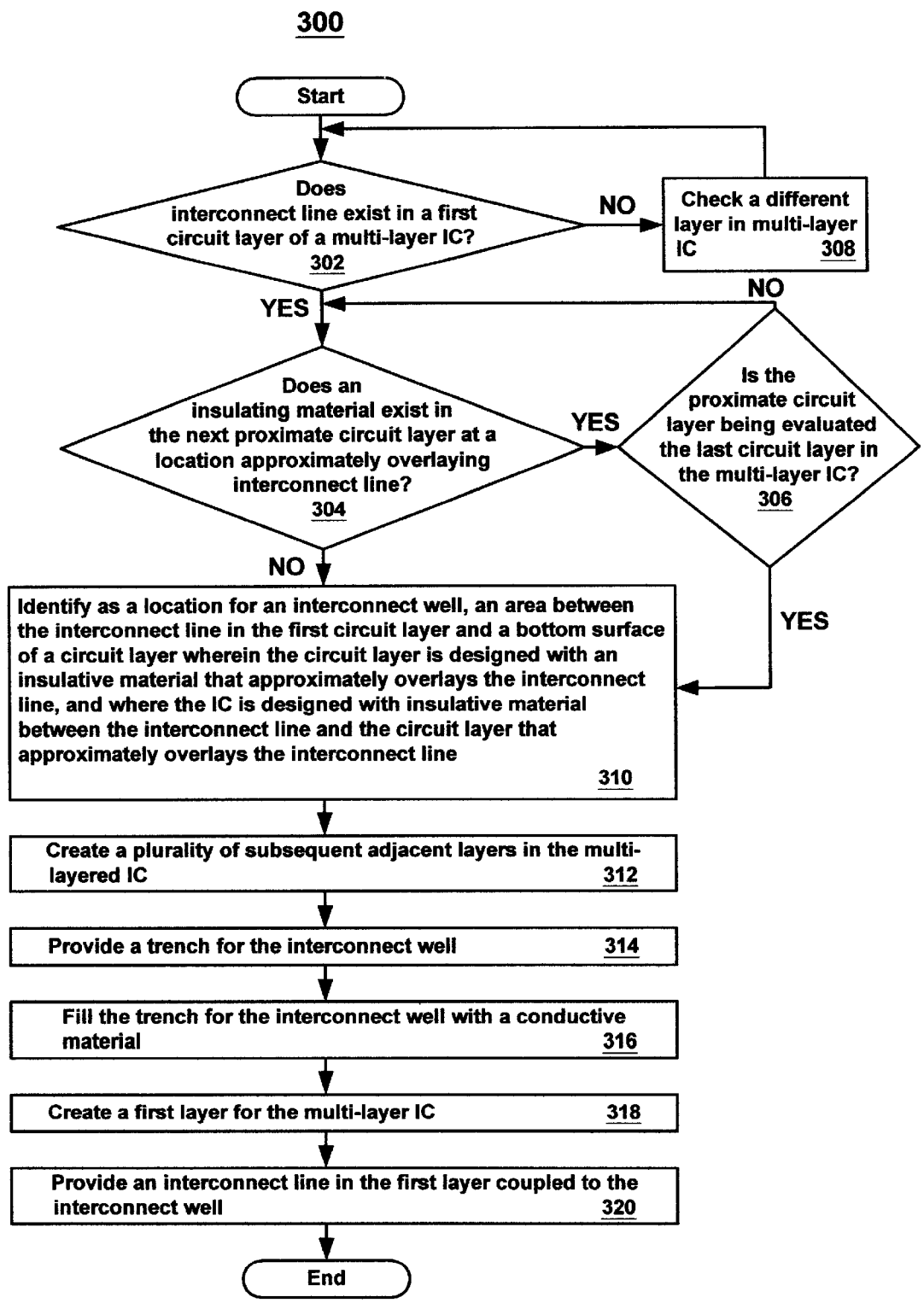
FIG. 3 is a flow chart of the steps performed to provide an interconnect with reduced resistance and delay, in accordance with one embodiment of the present invention.

Referring to FIG. 3, a flow chart 300 of the steps performed to provide an interconnect with reduced resistance, and consequently reduced delay, in accordance with one embodiment of the present invention is presented. The steps presented in flowchart 300 will be described with reference to the hardware illustrated in FIGS. 2A and 2B described hereinabove.

In step 302, an inquiry is made whether an interconnect line exists in a first circuit layer of a multilayer IC. If an interconnect line does exist in a first circuit layer of a multilayer IC, then flowchart 300 proceeds to step 304. If an interconnect line does not exist in a first circuit layer of a multilayer IC, then flowchart 300 proceeds to step 308. The purpose of the inquiry is to have a starting point for creating an interconnect well. Because the interconnect well is provided to decrease the resistance and the delay of an interconnect line, if no interconnect line exists, then a well is not needed. The present embodiment refers to a first circuit layer simply as a starting point for the steps. The first circuit layer could be any layer in a multilayer IC.

In step 308, a different layer in multilayer IC is checked. As an example of applying the steps to hardware, FIG. 2 presents intermediate layer 204 in view D—D. Because this layer has no interconnect lines, flowchart 300 would proceed to step 308. In step 308, for example, different layer 206 of multilayer IC 200 could next be evaluated. Because layer 206 has an interconnect line 208, flowchart 300 would proceed to step 304 from step 302.

In step 304, an inquiry is made whether an insulative area exists in a proximate circuit at a location approximately below the interconnect line. If an insulative area does exist, with respect to this inquiry, then flowchart 300 proceeds to step 306. If an insulative area does not exist, with respect to this inquiry, then flowchart 300 proceeds to step 310. As an example, using FIG. 2B, step 304 could be applied to interconnect line 208 located in layer 202. Examining View D—D in FIG. 2B, there is a conductive area in layer 206 approximately below interconnect line 208. Consequently, this area is not a good candidate for an interconnect well, and flowchart 300 would then proceed to step 310.

As mentioned in the description of FIGS. 2A and 2B, another embodiment of the present invention can treat layer 202 and 204 as a single layer. That is because they can both have a dielectric material that can be formed at the same time. Dielectric material 203 in layer 202 and 204 can be built up over layer 206 in one operation. Afterwards, a trench for interconnect line 208 can be formed to a depth that is represented by the thickness of layer 202 illustrated in FIG. 2B, e.g. in the section D—D. If an interconnect well or a via is to be included, then it can be etched in before or after etching a trench for the interconnect line 208. Thus, FIG. 2 illustrates three layers 202, 204, and 206 for purposes of clarity rather than for purposes of requiring a specific fabrication for general IC layers and components. Rather, the present invention is suited to a variety of fabrication techniques. In the present flowchart 300, any references to subsequent adjacent layers can be interpreted with this alternative embodiment in mind.

In step 306, an inquiry is made whether the proximate circuit layer is the last circuit layer to be analyzed in the multilayer IC. If the proximate circuit layer evaluated is the last circuit layer to be analyzed in the multilayer IC, then flowchart 300 proceeds to step 310. If the proximate circuit layer is not the last circuit layer to be analyzed in the multilayer IC, then flowchart 300 proceeds to step 304. The purpose of this inquiry is to cease the do-loop inquiry for each layer in the multilayer IC 200 when no more layers exist. While the example provided in FIGS. 2A and 2B illustrates a first circuit layer 202 with subsequent layers 204 and 206 only on one side of first circuit layer 202, the present invention would be equally applicable for layers that could exist on the other side of first circuit layer 202.

In the present example, for view D—D of FIG. 2B, continued from the previous step 306, circuit layer 206 is the last layer to be evaluated in multilayer IC 200. Hence, flowchart 300 would proceed to step 310. If additional circuit layers existed below circuit layer 206, then flowchart 300 would proceed to step 304. Likewise, if additional circuit layers existed above circuit layer 206, then flowchart 300 would proceed to step 304 for those circuit layers.

In step 310, a location for the interconnect well can be located between an interconnect line in a first circuit layer and a bottom surface of a second circuit layer meeting the following conditions. The second circuit layer design has an insulative material in an area approximately overlaying the interconnect line and the material between the second circuit layer and the interconnect line is designed to be an insulative material. While the example presented in FIGS. 2A and 2B only illustrate two circuit layers 202 and 206, the present invention is well suited to many circuit layers. If multiple circuit layers satisfied the requirement of having insulative material, then interconnect well could be a continuous well traversing several layers in a multilayered IC on either side of first layer having the interconnect line. Thus, the second circuit layer could actually be a bottom circuit layer in the multilayered IC with one or more intermediate circuit layers and dielectric layers in between the first and second circuit layer.

Applying step 310 to the embodiment in view D—D of FIG. 2B, there is no location where an interconnect would exist in a first circuit layer and an insulating layer would exist in a proximate circuit layer. Specifically, circuit layer 206 is proximate to first circuit layer 202 but only has conducting material, e.g. interconnect line 214, approximately overlaying interconnect line 208 at section D—D. In other words, interconnect line 208 in layer 202 and interconnect line 214 in layer 206 are meant to be insulated from each other. Consequently, section D—D does not provide any ideal candidate locations for an interconnect well. There is only one insulating dielectric layer 204 between them, and is required for insulation and for capacitive isolation between interconnect lines approximately overlaying each other in proximate circuit layers. Hence, section D—D would not be an ideal candidate for a interconnect well in accordance with the present embodiment. In another embodiment of the present invention, only a portion of a layer of dielectric needs to exist between the interconnect well and another conductor.

In contrast, if section E—E of FIG. 2B were evaluated per flowchart 300, it would be a more ideal interconnect well site, assuming interconnect well 220 did not exist prior to the evaluation. Section E—E has a proximate circuit layers 206 that has an insulative area that approximately overlays the interconnect line 208 in first circuit layer 202. The reference to a proximate circuit layer means a circuit layer that is separated by another circuit layer by only one layer of dielectric material to prevent shorting between the circuit layers. Consequently, at least one of the layers 204 would be implemented for an interconnect well 220. Depending on what material existed in a unshown subsequent adjacent layers to 206, e.g. not shown, interconnect well 220 might exist through part or all of layer 206 and through the unshown proximate circuit layers. In another embodiment, interconnect well can exist continuously in a plurality of layers so long as the conditions of flowchart 300 are satisfied. For example, if three circuit layers are proximate to each other, e.g. subsequently adjacent to each other, and insulative material approximately overlaying an interconnect line in a first circuit layer exists in all the subsequently adjacent layers, then the interconnect well can exist continuously in all these layers.

The IC is designed so that capacitive effects between interconnects and components in the IC are minimized. In one embodiment, the interconnect well is designed such that sufficient insulator material exists between the conductive material in the interconnect well and any adjacent conductors or components that would have a capacitive interaction. In the present embodiment, the interconnect well would have a minimum capacitive effect that would not significantly exceed the capacitive effect of the IC design without the interconnect well. In another embodiment, the interconnect well can have a greater or a lesser capacitive effect on other interconnects or components in the circuit, with a respective trade-off in the change in resistance from the larger cross-sectional area of the interconnect.

In one embodiment, steps 302 through 310 are performed in a design and analysis phase of the circuit. However, they could be performed at other phases as well. In the design and analysis phase of a circuit, a netlist used in Hardware Description Language (HDL) analysis of a circuit, could be used to implement some of the steps of flowchart 300. The netlist, and other files in an HDL program describe the circuit properties, characteristics, performance, and geometry. Thus, they could be analyzed for the criteria presented in the present flowchart 300. Consequently, a quick and efficient computerized analysis could implement the present invention. Alternative methods to the present embodiment are equally applicable. For example, one embodiment could utilize manual or CAD based analysis and design.

The following steps refer to the fabrication operation of creating the interconnect well. In step 312, a plurality of proximate layers in the multilayered IC are created. This step utilizes conventional manufacturing techniques for masking and material deposition. Thus, for example, in FIG. 2B, layers 206 and 204 would be formed, one on top of the other.

Step 314 provides a trench for the interconnect well. This step utilizes conventional manufacturing techniques for masking and for etching to produce a trench. The trench for the interconnect well conforms to the parameters from the aforementioned analysis in flowchart 300. In one embodiment, a trench for interconnect well 220 might be formed at the time an interconnect via, e.g. 210, was formed. In another embodiment, the trench for interconnect well 220 might be formed at the layer just before the interconnect line is formed, if a plurality of layers will have the interconnect well. Alternatively, another embodiment might provide a trench for the interconnect well at the same time a trench is provided for the interconnect line.

For example, as shown in FIG. 2B, a trench for interconnect well 220 might be provided at the time a trench for interconnect line 208 is provided. That is, the etching will not cease after a trench for interconnect 208 is formed. Instead, the etching will continue to etch through proximate additional layer(s), e.g. layer 204. These and other embodiments are equally applicable to the present invention.

Step 316 fills the trench for the interconnect well with a conductive material. In one embodiment, the conductive material for the interconnect well is the same conductive material used for the interconnect line itself. In another embodiment, the conductive material used for the interconnect well is electroplated bulk copper. In one embodiment, the trench for the interconnect well can be filled at the same time the trench for the interconnect line is filled. In another embodiment, the trench for the interconnect well is filled after it is made and before the next layer is made, e.g. first circuit layer 202. Thus, for example, a trench for interconnect well 220 could be filled after the formation of layer 204 and before the formation of first circuit layer 202. Alternatively, the trench for interconnect well 220 could be filled at the time the trench for 208 is filled. These and other embodiments are equally well suited to the present invention.

Step 318 creates a first circuit layer of the multilayered IC. In this step, the layer with the interconnect line being analyzed is created. Conventional means are used to create this layer. Again, the significance of the 'first' layer is that it is the layer being analyzed for a modified interconnect line, e.g. one with an interconnect well. Hence, the first circuit layer is not unique to a multilayered IC. Rather, it is a title that can be applied to and used for other layers analyzed in the multilayered IC.

Step 320 provides an interconnect line in the first circuit layer that is coupled to the interconnect well. The interconnect line is provided using conventional techniques. The interconnect line is coupled to the interconnect well to provide the reduced resistance and reduced delay for the interconnect.

As shown in FIGS. 2A and 2B, the present embodiment provides for an interconnect well that can exist along portions of the interconnect line and not along other portions. Consequently, as shown in the cross-sections, views D—D and F—F do not have an interconnect well while view E—E does have an interconnect well. However, the present invention is equally applicable to an interconnect well that exists for the entire length of interconnect line. Likewise, an interconnect well can exist on one of an interconnect line, e.g. an upper side, in one area and on another side of an interconnect line, e.g. a lower side, in another area, or any combination of these embodiments. The present invention is equally well suited to any component in an IC that might require additional adjacent material to improve its performance.

Steps 310 through 316 can be repeated for an interconnect well located approximately above the interconnect line. The requirements for proximate adjacent layers having insulative areas approximately overlaying the interconnect line would be equally applicable. Hence, while not shown, the present invention provides for, and is applicable to, an interconnect well on either side of the interconnect line.

While the present embodiment analyzes only the placement of a single interconnect well, the present invention is equally applicable to more complex IC structures where the basic steps provided herein could be applied continuously and in parallel to the many layers, interconnect lines, etc. of the IC.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A modified interconnect having reduced resistance for use in a multilayered Integrated Circuit (IC), said interconnect comprising:

an interconnect line, said interconnect line existing in a first circuit layer of said multilayered IC, said interconnect line comprised of a conductive material, said interconnect line having a depth in said multilayered IC;

an interconnect well, said interconnect well coupled to said interconnect line, said interconnect well having a depth in said multilayered IC that exceeds said depth of said interconnect line, said interconnect well insulated from other conductive materials in said multilayered IC, said interconnect well located between said interconnect line and a bottom surface of a second circuit layer, said second circuit layer is an insulative material at a location approximately overlaying said interconnect line, wherein a material between said interconnect line and said second circuit layer is also an insulative material, said depth of said interconnect well extends into at least one of a plurality of subsequent adjacent layers in said multilayered IC, said plurality of subsequent adjacent layers located adjacent to said first circuit layer.

2. The modified interconnect recited in claim 1 wherein said depth of said interconnect well extends into at least one of a plurality of subsequent adjacent layers in said multilayered IC, said plurality of subsequent adjacent layers located adjacent to said first circuit layer.

3. The modified interconnect recited in claim 1 wherein said second circuit layer is the closest circuit layer to said first circuit layer.

4. The modified interconnect recited in claim 1 wherein said interconnect well is insulated from other conductive materials in said multilayered IC to reduce capacitive interaction.

5. The modified interconnect recited in claim 1 wherein said interconnect well is comprised of a conductive material essentially the same as said conductive material of said interconnect line.

6. The modified interconnect recited in claim 1 wherein said interconnect well has a bottom surface located above a bottom surface of said plurality of subsequent adjacent layers.

\* \* \* \* \*